United States Patent

Ward et al.

[11] Patent Number: 5,693,147
[45] Date of Patent: Dec. 2, 1997

[54] DMETHOD FOR CLEANING A PROCESS CHAMBER

[75] Inventors: Steven D. Ward; Paul V. Avona, both of Phoenix, Ariz.

[73] Assignee: Motorola, Inc., Schaumburg, Ill.

[21] Appl. No.: 552,665

[22] Filed: Nov. 3, 1995

[51] Int. Cl.$^6$ ........................ B08B 7/00
[52] U.S. Cl. .................. 134/1.1; 13/1.2; 13/1.3
[58] Field of Search ............... 134/1, 1.1, 1.2, 134/1.3; 156/345, 643.1; 216/63, 67, 64

[56] References Cited

U.S. PATENT DOCUMENTS

| | | | |
|---|---|---|---|
| 4,786,352 | 11/1988 | Benzing | 156/345 |
| 4,983,254 | 1/1991 | Fujimura et al. | 156/643.1 |
| 5,007,981 | 4/1991 | Kawasaki et al. | 134/1.2 |
| 5,198,634 | 3/1993 | Mattson et al. | 219/121.43 |
| 5,348,619 | 9/1994 | Bohannon et al. | |
| 5,354,962 | 10/1994 | Mizuno et al. | |
| 5,382,316 | 1/1995 | Hills et al. | 216/67 |

OTHER PUBLICATIONS

Hawley's Condensed Chemical Dictionary, Van Nostrand Reinhold, 1993, p. 531.

J. Kikuchi et al., "Native Oxide Removal on Si Surfaces by $NF_3$–Added Hydrogen and Water Vapor Plasma Downstream Treatment", J. Appl. Phys., vol. 33, Apr. 1994, Japan, pp.2207–2211.

B. Bohannon et al., "Post Metal Etch Residue Removal Using Vapor Phase Processing Technology", Proceedings –Institute of Environmental Sciences, 1993, pp. 275–281.

S. Jimbo et al., "Resist and Sidewall Film Removal after A1 Reactive Ion Etching (RIE) Employing $F+H_2O$ Downstream Ashing", J. Appl. Phys., vol. 32, 1993, Japan, pp. 3045–3050.

Primary Examiner—Timothy McMahon
Assistant Examiner—Alexander Markoff
Attorney, Agent, or Firm—Robert F. Hightower

[57] ABSTRACT

Fluorocarbon and water vapor are introduced directly into a plasma in a process chamber, not downstream from the plasma, thereby creating HF vapor to clean the process chamber. The process may also be used to remove a photoresist residue left remaining on a semiconductor wafer.

16 Claims, 1 Drawing Sheet

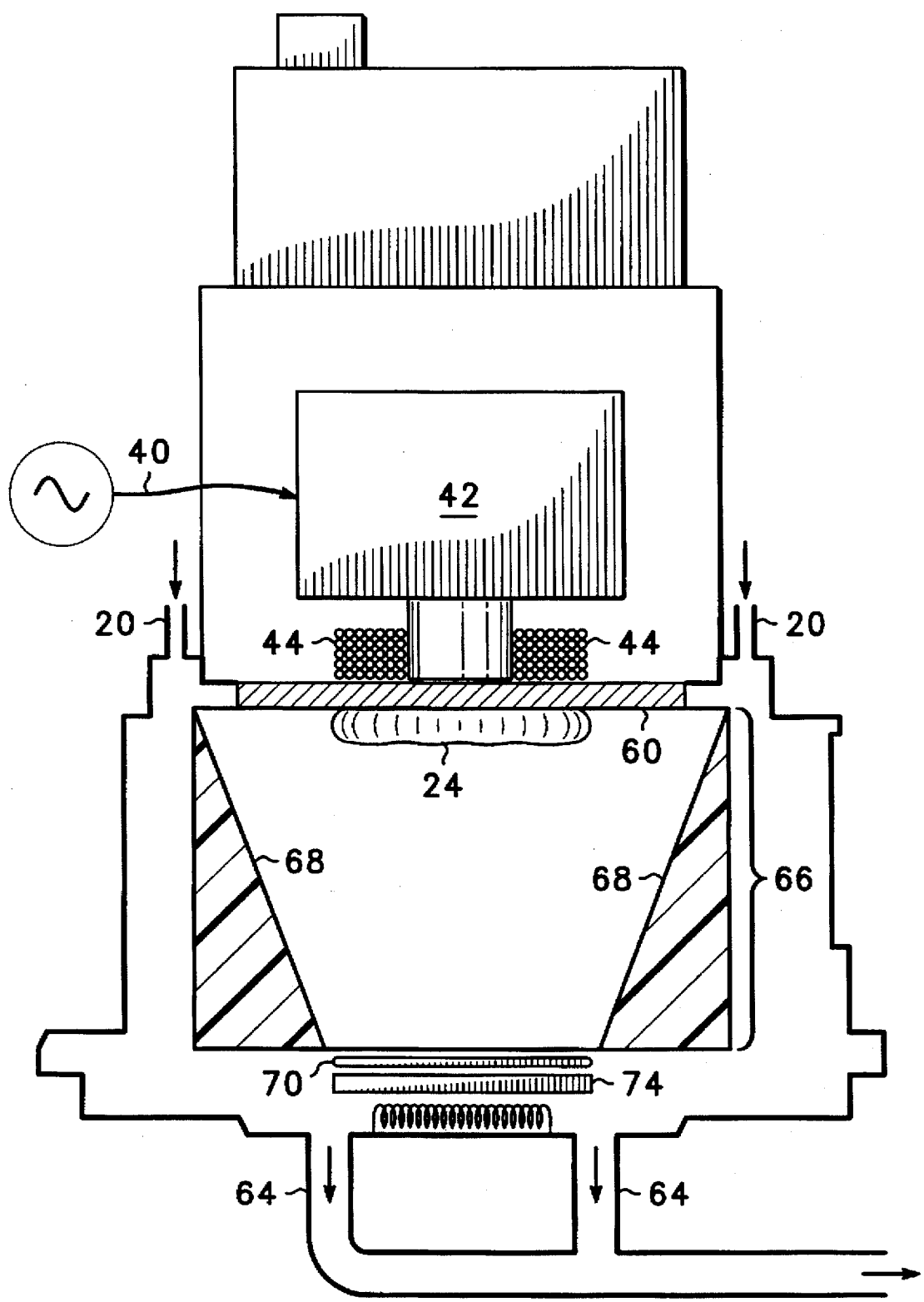

DMETHOD FOR CLEANING A PROCESS CHAMBER

BACKGROUND OF THE INVENTION

The present invention relates in general to integrated circuit processes and, more particularly, to a method for cleaning the quartz chambers frequently used in integrated circuit processes.

It is common during the manufacture of integrated circuits for certain process steps to take place in an evacuated chamber. During certain steps utilizing plasmas created using high energy RF signals the chamber, or portions thereof, may be constructed of a quartz material.

During certain production steps such as removing photoresist after an etching process, it is sometimes common for the resist strip rate to decrease after several production cycles. A common method to correct this drop in resist removal rate has been to clean the quartz portions of the chamber in a hydrofluoric acid (HF) solution.

However, in order to accomplish this procedure the chamber must be disassembled and reassembled, causing costly delays in the manufacturing process. In addition, a separate area must be maintained to accomplish the cleaning process and personnel trained to accomplish same.

It has also been suggested that HF in a vapor phase may be added to a chamber during certain integrated manufacturing process steps to remove residue from the wafer being processed. While this process would presumably also provide a cleaning of the chamber containing the wafer, it would require at the very least an additional HF vapor supply source and the associated plumbing and other hardware required to introduce the HF vapor to the chamber at the appropriate rate, pressure and temperature.

As these cleaning methods require either a separate chamber and associated process steps or at least additional plumbing hardware and a separate HF vapor supply, it would be advantageous to provide a cleaning process that utilizes existing hardware and gas supplies which are ordinarily used for other process steps, to create vapor phase HF in a plasma in the chamber, thereby providing a cleaning of the chamber without dedicated gas supplies or additional hardware.

BRIEF DESCRIPTION OF THE DRAWING

The sole FIGURE is a cross-sectional diagram of a typical stripper chamber in which the method of the present invention would be used.

DETAILED DESCRIPTION OF THE DRAWING

During the manufacture of integrated circuits it is common to place material known as resist on top of a semiconductor wafer in desired patterns and to etch away or otherwise remove surrounding material not covered by the resist pattern in order to produce metal conductor runs or other desired features. Once these steps have been accomplished, the resist which remains on top of the desired features may be removed in a quartz chamber using a plasma of $O_2$ or a combination of $CF_4$ and $O_2$ to react with the resist material.

This reaction may take place in a stripper chamber such as the LAM TCP 9600 DSQ Stripper. A typical cross section of such a chamber illustrating the essential parts is shown in the FIGURE. During the stripping process the process gas, ordinarily oxygen, is provided to the chamber via gas inlets 20. A high power RF signal 40 is applied via a matching network 42 to a coil 44 mounted adjacent to a quartz disk 60 which forms the top of the chamber.

The RF energy excites the process gases and creates a planar plasma 24 directly above the wafer 70 which rests on a heated wafer paddle 74. The plasma contains molecular oxygen $O_2$ which has been split into a more reactive form O. The atomic oxygen chemically strips the photoresist by reacting with the carbon and hydrogen in the organic resist material to form gaseous byproducts. The byproducts include CO, $CO_2$ and $H_2O$, which are pumped out of the chamber via exhaust ports 64. Although oxygen is ordinarily the primary process gas, small additions of fluorocarbons, such as $CF_4$ or $C_2F_6$, are sometimes used to increase the strip rate or to remove hardened resist.

A quartz spacer 66 and funnel 68 form additional major parts of the stripper chamber. The heated wafer paddle 74 raises the temperature of the wafer 70 and the quartz containment funnel 68 limits plasma dispersion and increases the concentration of atomic oxygen at the surface of wafer 70 during the stripping process.

There is another process step which might require water vapor. This process step is the corrosion passivation of metal conductor lines, thus certain models of the stripper chamber would therefore have $H_2O$ or water vapor provided to the gas inlets 20. The water vapor introduced into the plasma has only been used during the corrosion passivation process in the past.

It has been the experience of some users of such a stripper chamber that the rate of removal of the resist, or strip rate, may decrease after a number of production cycles. It has also been the experience of these users, and common practice in the industry, to regain the original strip rate by periodically cleaning the quartz portions of the chamber such as quartz disk 60, spacer 66 and funnel 68 in an HF liquid solution. This is ordinarily accomplished by disassembling the chamber and placing only those parts in a HF solution.

During this HF cleaning of the quartz parts in the prior art, the chamber is not usable and production of wafers must therefore halt until the parts are cleaned and the chamber reassembled. Some users have somewhat reduced this downtime by obtaining spares for the parts in question in order that the chamber may be reassembled and used for production with one set of parts while the other set of parts is being cleaned. This requires additional cost for the spare parts and still does not eliminate the time required to disassemble and reassemble the chamber.

The present invention comprises a method for forming HF vapor in the chamber using the existing supplies of $H_2O$ and a fluorocarbon when wafer 70 is not present in the chamber. The fluorocarbon is typically comprised of $CF_4$ or $C_2F_6$. To accomplish the cleaning the wafer is simply removed and appropriate amounts of the fluorocarbon and $H_2O$ vapor injected into the chamber in the presence of the RF signal thereby creating a plasma. The RF serves to breakdown the $H_2O$ and the fluorocarbon into other forms including H and F which recombine to form HF vapor. This HF vapor comes into contact with those portions of the inside of the quartz chamber which had been exposed during the stripping process, thereby cleaning the chamber and restoring the strip rate to its previous level.

This process may also be used to remove any photoresist residue left on wafer 70 after the resist stripping process using oxygen. The residue remaining on wafer 70 is on sidewalls of the pattern etched in wafer 70. Such residue is typically referred to as a "veil."

It is important to note that the water vapor and the fluorocarbon are provided directly into the area where a plasma is generated and not provided downstream from the area where the plasma is generated as has been done in the prior art. Providing the water vapor or the fluorocarbon downstream is not believed to produce adequate cleaning of the chamber or of the residue removal on wafer 70, because it is not exposed directly to the plasma. When the water vapor or the fluorocarbon is provided downstream from the plasma it is believed that a significant amount of HF vapor is not formed. In fact, it has been reported in the prior art that the use of a downstream etching system where the water vapor is not provided directly into the plasma, does not remove the resist residue from a semiconductor wafer, and will presumably not remove any residue formed on the walls of the process chamber.

The inventive process is extremely cost effective for cleaning in that the chamber need not be disassembled and the cleaning step could in fact simply be incorporated into the normal manufacturing process as a separate step performed after a predetermined number of wafers have been processed. In addition there is no need for additional plumbing as the required gases are separately already supplied for other process steps. The removal of resist residue from wafer 70 may also be performed. This residue removal may be performed insitu, thereby reducing any extra handling of wafer 70.

This same cleaning could, in theory, be accomplished by independently providing HF vapor to the chamber as a separate step, but this would require a separate hardware inlet and a separate outside handling and supply of HF gases, which would cause additional cost and safety concerns. HF is a hazardous chemical, thus it is desirable to form HF only when it is needed in the process chamber, rather than having to house a HF near the process chamber.

In one embodiment of the present invention, $H_2O$ vapor at flows of approximately 50 sccm to 100 sccm is combined with $CF_4$ at flows of approximately 50 sccm to 100 sccm in the presence of a chamber pressure of 500 mtorr to 1100 mtorr, and an RF field of approximately 600 to 1200 watts and a frequency on the order of 10–15 Mhz. The particular gas amounts and pressures, as well as the RF energy characteristics would be varied as required to tailor a particular cleaning process for a particular chamber.

While the invention has been described in some detail in connection with a particular apparatus, it is to be understood that variations in certain aspects may be made without departing from the scope of the invention. For example, fluorocarbons other than $CF_4$ or $C_2F_6$ may be used and variations of the pressures, gas amounts and RF energy may be used as long as the resultant HF vapor is created within the process chamber. Other apparatus, such as an Applied Materials ASP or other resist strippers made by Gasonics, Matrix, or Mattson may be utilized with the present invention. Other changes in the details of the described embodiment, and additional embodiments will be apparent to those of ordinary skill in the art. All such variations are intended to be within the scope of the invention as claimed.

What is claimed is:

1. A process for cleaning a process chamber comprising the steps of:
   forming a plasma in the process chamber; and
   introducing water vapor and a fluorocarbon into the plasma in the process chamber to form hydrogen fluoride vapor wherein the fluorocarbon volume is 33% to 67% of the total volume.

2. A process in accordance with claim 1 wherein said fluorocarbon is comprised of carbon tetrafluoride.

3. A process in accordance with claim 1 wherein said water vapor and said fluorocarbon are introduced into said chamber by directly plumbing the water vapor into the process chamber and directly plumbing the fluorocarbon into the process chamber.

4. A process in accordance with claim 1 wherein said water vapor and fluorocarbon are introduced utilizing apparatus which is primarily used for an integrated circuit manufacturing process in said chamber.

5. A process in accordance with claim 1 wherein said forming step is accomplished in the presence of an RF field of approximately 600 to 1200 watts and a frequency of approximately 10–15 Mhz.

6. A process in accordance with claim 5 wherein said forming step is accomplished with a chamber pressure of approximately 500 to 1100 mtorr.

7. A process in accordance with claim 1 wherein said introducing step is accomplished with water vapor and fluorocarbon flow rates of approximately 50 to 100 sccm.

8. A process in accordance with claim 1 wherein said process for cleaning is accomplished as part of an integrated circuit manufacturing process which includes integrated circuit manufacturing process steps before and after said process for cleaning.

9. A process for removing photoresist residue, comprising the steps of:
   providing a process chamber;
   introducing water vapor and a fluorocarbon directly into the process chamber with water vapor and fluorocarbon flow rates of approximately 50 to 100 sccm; and
   forming a plasma in the process chamber to form a plasma of a hydrogen fluoride vapor.

10. The process of claim 9, wherein the process chamber does not contain any semiconductor wafers for manufacture so that a photoresist residue is removed from the process chamber.

11. The process of claim 9, further comprising the steps of:
    providing a semiconductor wafer in the process chamber, wherein the hydrogen fluoride vapor removes a photoresist residue disposed on the semiconductor wafer.

12. The process of claim 9 wherein said forming step is accomplished in the presence of an RF field of approximately 600 to 1200 watts and a frequency of approximately 10–15 Mhz.

13. The process of claim 9 wherein said forming step is accomplished with a chamber pressure of approximately 500 to 1100 mtorr.

14. A process for removing photoresist residue, comprising the steps of:
    providing a process chamber having an area where a plasma is generated;
    forming a plasma in the area where a plasma is generated in the process chamber; and
    introducing water vapor and a fluorocarbon directly into the area where the plasma is generated in the process chamber to form a hydrogen fluoride vapor wherein the fluorocarbon volume is approximately 33% to 67% of the total volume.

15. The process of claim 14, wherein the process chamber does not contain any semiconductor wafers for manufacture so that a photoresist residue is removed from the process chamber.

16. The process of claim 14, further comprising the steps of:
    providing a semiconductor wafer in the process chamber, wherein the hydrogen fluoride vapor removes a photoresist residue disposed on the semiconductor wafer.

* * * * *